(12) United States Patent
Tiruvuru et al.

(10) Patent No.: US 11,669,135 B2
(45) Date of Patent: Jun. 6, 2023

(54) INTER-CHIP INPUT-OUTPUT (IO) FOR VOLTAGE-STACKED NEAR THRESHOLD COMPUTING (NTC) CHIPS

(71) Applicant: DXCorr Design Inc., Sunnyvale, CA (US)

(72) Inventors: Rajesh Tiruvuru, Bangalore (IN); Sagar Vidya Reddy, Santa Clara, CA (US)

(73) Assignee: DXCorr Design Inc., Sunnyvale, CA (US)

( * ) Notice: Subject to any disclaimer, the term of this patent is extended or adjusted under 35 U.S.C. 154(b) by 0 days.

(21) Appl. No.: 17/402,724

(22) Filed: Aug. 16, 2021

(65) Prior Publication Data

US 2023/0051176 A1 Feb. 16, 2023

(51) Int. Cl.
*G06F 1/00* (2006.01)
*G06F 1/18* (2006.01)
*G06F 1/3296* (2019.01)

(52) U.S. Cl.
CPC ............ *G06F 1/189* (2013.01); *G06F 1/3296* (2013.01)

(58) Field of Classification Search
CPC .............................. G06F 1/189; G06F 1/3296
See application file for complete search history.

(56) References Cited

U.S. PATENT DOCUMENTS

| | | | | |
|---|---|---|---|---|
| 9,614,526 | B1* | 4/2017 | Kapoor | H03K 3/012 |
| 9,934,898 | B2* | 4/2018 | Mattsson | H01L 23/5227 |
| 9,960,670 | B2* | 5/2018 | Kapoor | H02M 3/33523 |
| 11,022,634 | B1* | 6/2021 | Lee | G01R 19/0084 |
| 2011/0148382 | A1* | 6/2011 | Tiruvuru | H02J 3/00 323/288 |
| 2012/0025806 | A1* | 2/2012 | Chui | G01R 19/2506 324/76.11 |
| 2016/0042793 | A1* | 2/2016 | Forbes | H01L 27/11556 365/185.18 |
| 2017/0108908 | A1* | 4/2017 | Kruglick | G06F 1/28 |

OTHER PUBLICATIONS

Brian Bailey; Near-Threshold Computing; Jun. 16, 2016; https://semiengineering.com/near-threshold-computing-2/.
S. Rajapandian; K.L. Shepard; P. Hazucha; T. Karnik; High-voltage power delivery through charge recycling; May 30, 2006; Published in: IEEE Journal of Solid-State Circuits ( vol. 41, Issue: 6, Jun. 2006); https://ieeexplore.ieee.org/document/1637604.

* cited by examiner

*Primary Examiner* — Mohammed H Rehman
(74) *Attorney, Agent, or Firm* — Jason C. Cameron

(57) ABSTRACT

A voltage stacked system that includes a stack of near threshold computing (NTC) chips for achieving inter-chip communication with simple wires as interconnections is disclosed. The chips include at least two secondary supply voltages and at least a secondary ground voltage electrically coupled to the stack of the chips arranged in series. The secondary supply and ground voltages are tapped in a predefined sequence at one or more predefined access points in the stack to generate two versions of an internal voltage within each of the chips. Each of the two versions of the internal voltage is a voltage difference between respective supply voltages and ground voltages, and the two have a set voltage shift such that the chips in the stack have supply voltages overlapping with those in the neighboring chips. Optionally, the two voltages are boosted to further higher voltages as needed using charge pumps.

17 Claims, 5 Drawing Sheets

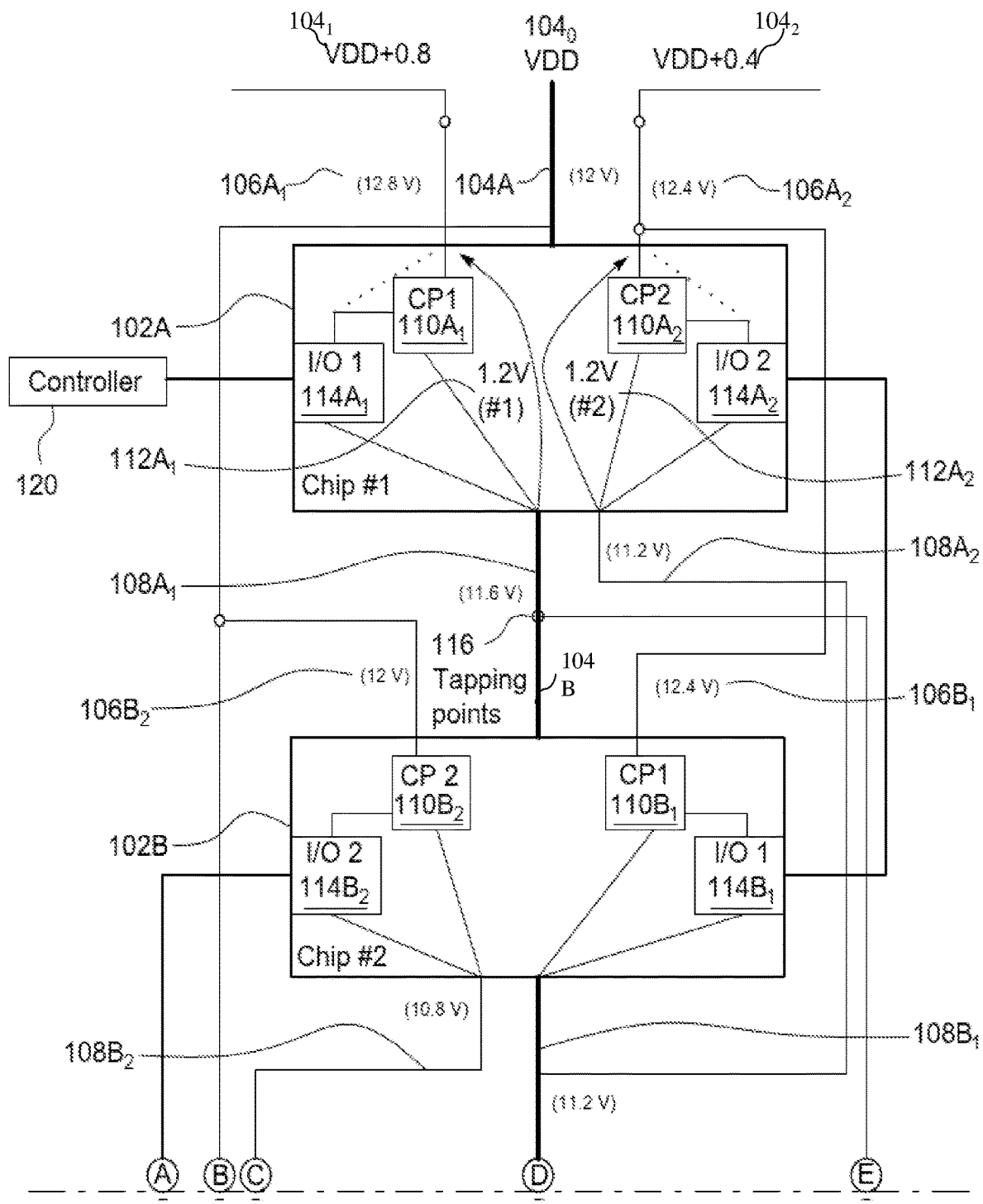
FIG. 3 (contd)

INTER-CHIP INPUT-OUTPUT (IO) FOR VOLTAGE-STACKED NEAR THRESHOLD COMPUTING (NTC) CHIPS

FIELD OF INVENTION

Embodiments of the present disclosure relate to inter-chip communication systems and more particularly to inter chip input-output (JO) for voltage stacked near threshold computing (NTC) chips.

BACKGROUND

Typically, any processing system comprises one or more chips configured to perform one or more computing tasks. These one or more chips communicate with each other for performing the one or more computing tasks. The one or more chips may include a controller chip, a memory, and the like. Typically, in some applications, the processing system may also comprise a near threshold computing (NTC) chips. The NTC chips are designed for minimum-energy computation. The NTC chips may be designed for performing the one or more computing tasks. Conventionally, the NTC chips operate at a supply voltage of, for example, 0.4V. However, such supply voltage of 0.4V are generally inefficient for power delivery. Therefore, in such cases, a higher supply voltage is used and the one or more chips, such as the NTC chips, are arranged in stacked fashion. This arrangement of stacking powers multiple low-voltage chips off of a single higher voltage by "stacking" the chips and recycling charge between layers.

During operation, each one of the chips in the stack, such as the NTC chips requires a standard supply voltages such as 1.8 V, 1.5 V or 1.2 V to communicate with other chips for performing the one or more computing tasks. For example, standard input output (IOs) devices such as low voltage complementary metal oxide semiconductor (LVCMOS) general purpose IOs (GPIO's), typically communicate with 1.8 V, 1.5 V or 1.2 V. However, the NTC chips have no voltages other than 0.4V, Further, there is no overlap between the supply voltages of the chips in the stack. Therefore, interconnecting other chips or the standard IOs between the one or more chips with simple wires will not work.

Hence, there is a need for a method to achieve inter-chip communication in voltage stacked near threshold computing systems using standard IOs with interconnections made of simple wires by addressing the aforementioned issues.

SUMMARY

This summary is provided to introduce a selection of concepts, in a simple manner, which is further described in the detailed description of the disclosure. This summary is neither intended to identify key or essential inventive concepts of the subject matter nor to determine the scope of the disclosure.

In accordance with an embodiment of the present disclosure, a voltage stacked near threshold computing system with standard general purpose input output (GPIO) based inter-chip communication is disclosed. The voltage stacked near threshold computing system includes a stack of near threshold computing chips arranged in series. Each of the near threshold computing chips include a primary supply voltage electrically coupled to the stack of the near threshold computing chips arranged in series. Further, the near threshold computing chip includes at least two secondary supply voltages electrically coupled to the stack of the near threshold computing chips arranged in series. The at least two secondary supply voltages are higher in value with respect to the primary supply voltage. Further, the near threshold computing chip includes a primary ground node and a secondary ground node having a lower value with respect to the primary ground node. The at least two secondary supply voltage and the secondary ground voltage are tapped in a predefined sequence at one or more predefined access points in the stack to generate two versions of an internal voltage, higher in value than a typical primary internal supply voltage of 0.4V, within each of the one or more near threshold computing chips. Each of the two versions of the internal voltage is a voltage difference between respective supply voltages and ground voltages. The each of the two versions of the internal voltage has a set voltage shift. One of the two versions of the internal voltage within one near threshold computing chip overlaps with at least one of the two versions of the internal voltage associated with one of a preceding near threshold computing chip and a subsequent near threshold computing chip in the stack. The each of the two versions of the internal voltage are configured for supplying standard in-chip functions.

In an alternate embodiment of the present disclosure, each of the near threshold computing chips further comprises one or more charge pumps electrically coupled to one or more input-output components, wherein the one or more charge pumps are configured to boost the two versions of the internal voltage to a higher voltage for communication between the near threshold computing chips within the stack. Further, the output of the one or more charge pumps are used for standard in chip functions.

In accordance with another embodiment of the present disclosure, a method for achieving inter-chip communication in voltage stacked near threshold computing systems is disclosed. The method includes providing a primary supply voltage and at least two secondary supply voltages to a stack of the near threshold computing chips arranged in series. The at least two secondary supply voltages are higher in value with respect to the primary supply voltage. Further, the method includes providing a primary ground voltage and a secondary ground voltage to the stack of the near threshold computing chips, where the secondary ground voltage has a lower value with respect to the primary ground voltage. Furthermore, the method includes computing desired voltage difference to be achieved between respective supply voltages and respective ground voltages for each of the near threshold computing chips in the stack. Also, the method includes tapping the at least two secondary supply voltages and a secondary ground voltage in a predefined sequence at one or more predefined access points in the stack based on the computed desired voltage difference. Furthermore, the method includes generating two versions of an internal voltage, higher in value than a typical primary internal supply voltage of 0.4V, within each of the near threshold computing chips with respect to the tapping, wherein the each of the two versions of the internal voltage has a set voltage shift. The each of the two versions of the internal voltage are configured for supplying standard in-chip functions. Additionally, the method includes enabling communication, via data lines, between each of the near threshold computing chips in the stack and with other chips in a processing system using the generated two versions of the internal voltage.

To further clarify the advantages and features of the present disclosure, a more particular description of the disclosure will follow by reference to specific embodiments thereof, which are illustrated in the appended figures. It is to be appreciated that these figures depict only typical embodiments of the disclosure and are therefore not to be considered limiting in scope. The disclosure will be described and explained with additional specificity and detail with the appended figures.

BRIEF DESCRIPTION OF DRAWINGS

The disclosure will be described and explained with additional specificity and detail with the accompanying figures in which.

Figure 1:
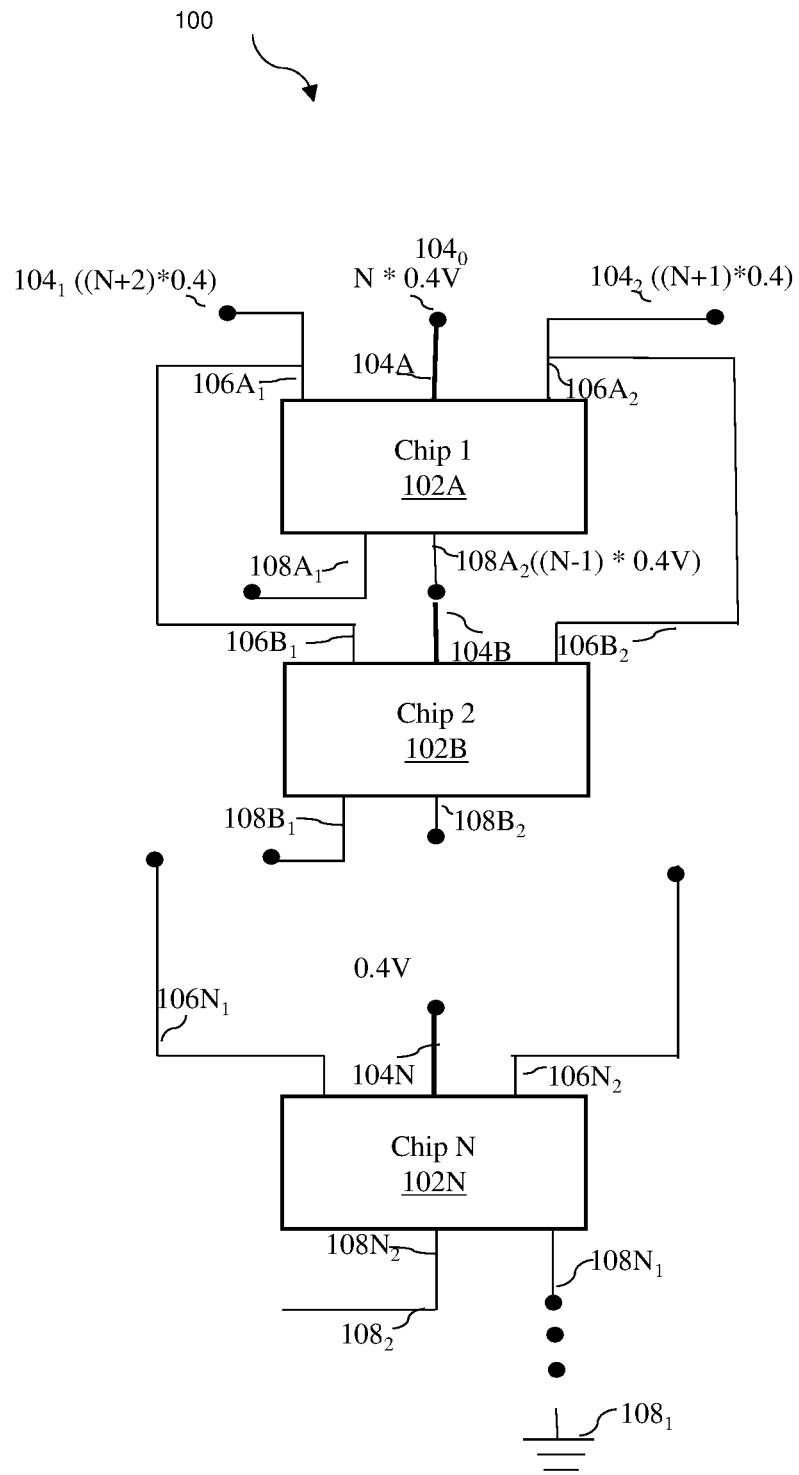
FIG. 1 is a schematic diagram of voltage stacked near threshold computing chips, in accordance with an embodiment of the present disclosure.

Further, those skilled in the art will appreciate that elements in the figures are illustrated for simplicity and may not have necessarily been drawn to scale. Furthermore, in terms of the construction of the device, one or more components of the device may have been represented in the figures by conventional symbols, and the figures may show only those specific details that are pertinent to understanding the embodiments of the present disclosure so as not to obscure the figures with details that will be readily apparent to those skilled in the art having the benefit of the description herein.

DETAILED DESCRIPTION OF THE DISCLOSURE

For the purpose of promoting an understanding of the principles of the disclosure, reference will now be made to the embodiment illustrated in the figures and specific language will be used to describe them. It will nevertheless be understood that no limitation of the scope of the disclosure is thereby intended. Such alterations and further modifications in the illustrated system, and such further applications of the principles of the disclosure as would normally occur to those skilled in the art are to be construed as being within the scope of the present disclosure. It will be understood by those skilled in the art that the foregoing general description and the following detailed description are exemplary and explanatory of the disclosure and are not intended to be restrictive thereof.

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

The terms "comprise", "comprising", or any other variations thereof, are intended to cover a non-exclusive inclusion, such that one or more devices or sub-systems or elements or structures or components preceded by "comprises . . . a" does not, without more constraints, preclude the existence of other devices, sub-systems, additional sub-modules. Appearances of the phrase "in an embodiment", "in another embodiment" and similar language throughout this specification may, but not necessarily do, all refer to the same embodiment.

Unless otherwise defined, all technical and scientific terms used herein have the same meaning as commonly understood by those skilled in the art to which this disclosure belongs. The system, methods, and examples provided herein are only illustrative and not intended to be limiting.

A computer system (standalone, client or server computer system) configured by an application may constitute a "module" (or "subsystem") that is configured and operated to perform certain operations. In one embodiment, the "module" or "subsystem" may be implemented mechanically or electronically, so a module may comprise dedicated circuitry or logic that is permanently configured (within a special-purpose processor) to perform certain operations. In another embodiment, a "module" or "subsystem" may also comprise programmable logic or circuitry (as encompassed within a general-purpose processor or other programmable processor) that is temporarily configured by software to perform certain operations.

Accordingly, the term "module" or "subsystem" should be understood to encompass a tangible entity, be that an entity that is physically constructed permanently configured (hardwired) or temporarily configured (programmed) to operate in a certain manner and/or to perform certain operations described herein.

Referring now to the drawings, and more particularly to FIGS. 1 through 4, where similar reference characters denote corresponding features consistently throughout the figures, there are shown preferred embodiments and these embodiments are described in the context of the following exemplary system and/or method.

FIG. 1 is a schematic diagram 100 of voltage stacked near threshold computing chips 102A-N, in accordance with an embodiment of the present disclosure. Any processing systems comprises one or more near threshold computing chips 102A-N configured to perform one or more compute tasks. The processing systems may include, for example, any ultra-low-energy computing, CPU, GPU, DPU, compute ASIC's and the like. The near threshold computing chips 102A-N may perform compute tasks. Each of these near threshold computing chips 102A-N are arranged in a form of stack. Each of the near threshold computing chips 102A-N in the stack are electrically inter-connected with each other using electrical wires (not shown).

The near threshold computing chips 102A-N are stacked in series to a main or primary supply voltage $104_0$. The primary supply voltage $104_0$ to the stack may be VDD=N*0.4V. The primary supply voltage $104_0$ is a high voltage $V_{DD}$ supply. Further, the stack of the near threshold computing chips 102A-N are electrically coupled to at least two secondary high supply voltages $104_1$-$104_2$ to the stack. The at least two secondary high supply voltages $104_1$-$104_2$ to the stack may be (VDD+0.4=(N+1)*0.4) and (VDD+0.8= (N+2)*0.4) respectively. Typically, the primary supply voltage 104A-N to each of the near threshold computing chips 102A-N is 0.4V with respect to the primary ground voltage $108A_1$-$N_1$ for the near threshold computing chips 102A-N. Each of the near threshold computing chips 102A-N are also supplied with at least two secondary supply voltages $106A_1$-$N_1$ and $106A_2$-$N_2$. The at least two secondary supply voltages $106A_1$-$N_1$ and $106A_2$-$N_2$ are higher in value with respect to the primary supply voltage. The at least two secondary supply voltages $106A_1$-$N_1$ and $106A_2$-$N_2$ to each of the near threshold computing chips 102A-N may be 0.8V (2*0.4V) and 1.2V (3*0.4V) respectively with respect to the primary ground voltage $108A_1$-$N_1$ for the near threshold computing chips 102A-N. The primary supply voltage $104_0$ and the at least two secondary supply voltages $106A_1$-$N_1$ and $106A_2$-$N_2$ are externally connected to the near threshold computing chips 102A-N in the stack. An exemplary reference value of the supply voltages 104, $106A_1$-$N_1$ and $106A_2$-$N_2$ are depicted in detail in FIG. 3.

Further, each of the near threshold computing chips 102A-N are electrically coupled to a primary ground voltage $108_1$ to the stack and a secondary ground voltage $108_2$ to the stack. Typically, the primary ground voltage $108_1$ to the stack may be 0V. Further, the secondary ground voltage $108_2$ to the stack may be a no connection if 102N is the last chip in the stack. Further, each of the near threshold computing chips 102A-N are supplied with a primary ground node $108A_1$-$N_1$ and a secondary ground node $108A_2$-$N_2$. The secondary ground node $108A_2$-$N_2$ is lower in value with respect to the primary ground node $108A_1$-$N_1$. Therefore, each of the near threshold computing chips 102A-N are supplied with three supply voltages and two grounds. During operation, the at least two secondary supply voltages $106A_1$-$N_1$ and $106A_2$-$N_2$ and the secondary ground node $108A_2$-$N_2$ are tapped in a predefined sequence at one or more predefined access points in the stack to generate two versions of an internal voltage, higher in value than a typical primary internal supply voltage of 0.4V, within each of the one or more near threshold computing chips 102A-N. The one or more predefined access points for the at least two secondary supply voltages $106A_1$-$N_1$ and $106A_2$-$N_2$ and the secondary ground voltage $108A_2$-$N_2$ for the near threshold computing chip 102A-N may be from the primary supply voltages to the stack $104_0$, $104_1$-$104_2$ or the primary ground voltages to the stack $108_1$, $108_2$ or the primary supply and ground voltages to the other near threshold computing chips in the stack.

Further, each of the two versions of the internal voltage is a voltage difference between respective supply voltages and ground voltages. Each of the two versions of the internal voltage has a set voltage shift. In one exemplary embodiment, the voltage shift may be 0.4V. The each of the two versions of the internal voltage are configured for supplying standard in-chip functions. The two versions of the internal voltage is depicted in FIG. 2 and FIG. 3 and the process of generation of the two versions of the internal voltage is depicted in FIG. 2.

In an embodiment, each of the near threshold computing chips 102A-N are configured to perform compute tasks received from a master controller. The master controller may be another chip in the processing system. Further, each of the near threshold computing chips 102A-N are configured to communicate with the master controller using one or more input-output components.

Figure 2:
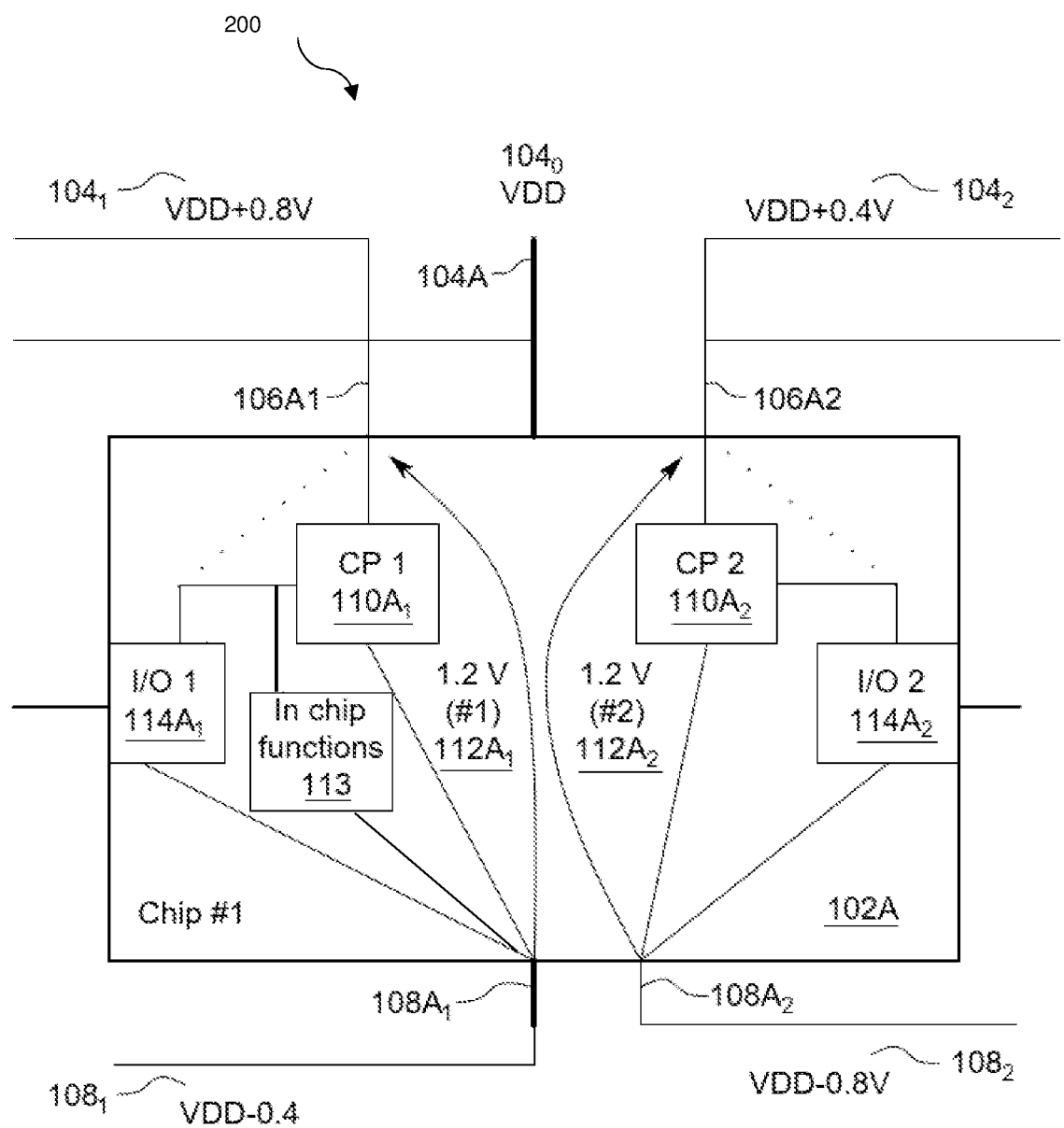
FIG. 2 is a block diagram illustrating various components of an exemplary near threshold computing chip, such as those shown in FIG. 1, capable of achieving inter-chip communication in voltage stacked near threshold computing systems, in accordance with an embodiment of the present disclosure.
Figure 3:
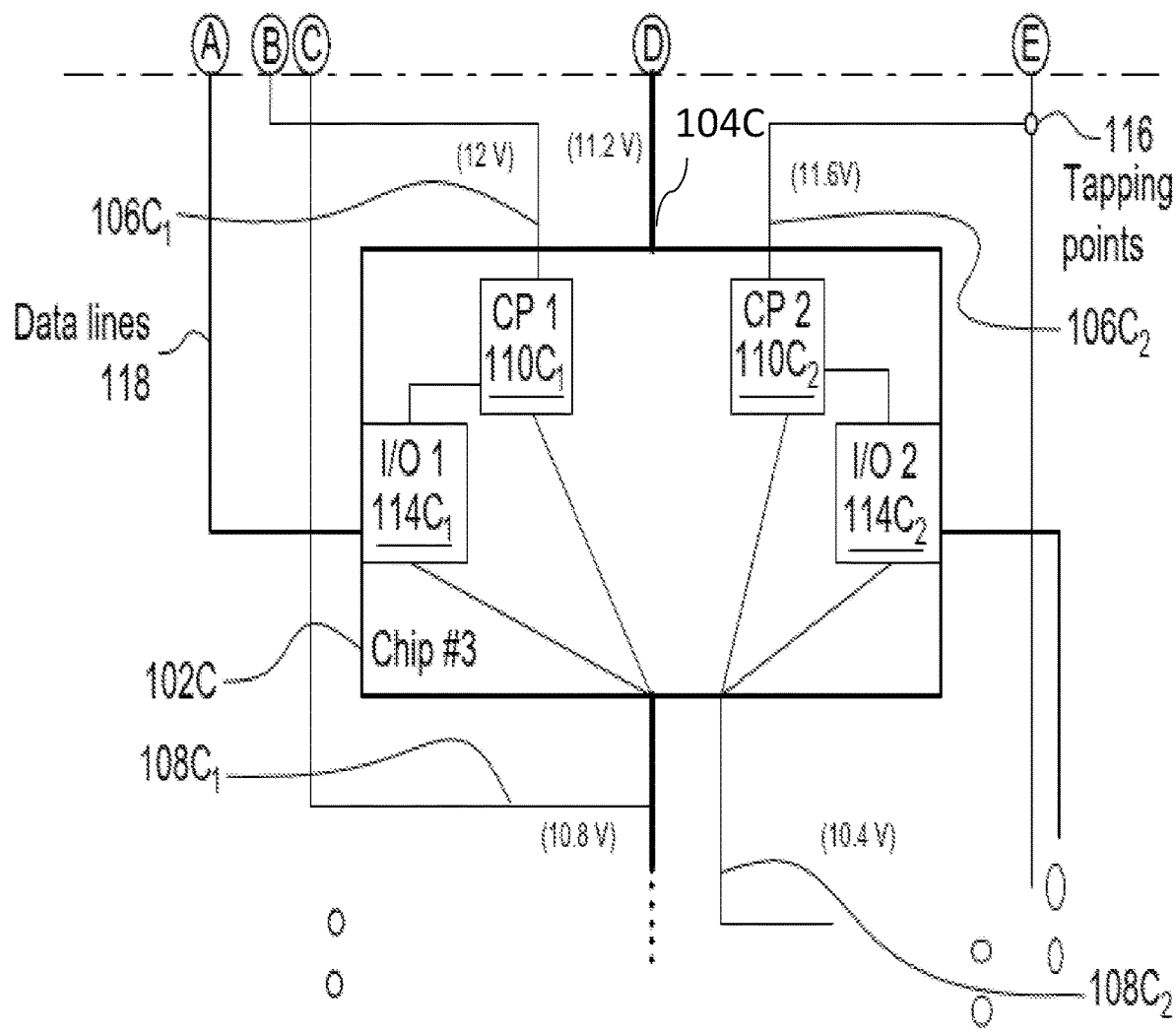
FIG. 3 is a block diagram of a stack of near threshold computing chips capable of generating two versions of the internal voltages, in accordance with an embodiment of the present disclosure.

FIG. 2 is a block diagram 200 illustrating various components of an exemplary near threshold computing chip 102A-N, such as those shown in FIG. 1, capable of achieving inter-chip communication in voltage stacked near threshold computing systems, in accordance with an embodiment of the present disclosure. FIG. 2 depicts one of the near threshold computing chip, say 102A among the stack of the near threshold computing chips 102A-N. The near threshold computing chip 102A comprises at least two input-output components 114A and an in-chip functions module 113 in addition to the primary supply voltage 104A, the at least two secondary supply voltages $106A_1$ and $106A_2$, the primary ground node $108A_1$ and the secondary ground node $108A_2$. In an exemplary embodiment, the primary supply voltage 104A may be from the primary supply voltage $104_0$ to the stack which is $V_{DD}$. The at least two secondary supply voltages $106A_1$ and $106A_2$ may be from the at least two secondary supply voltages $104_1$-$104_2$ to the stack which are $V_{DD}$+0.8V and $V_{DD}$+0.4V respectively. Further, the primary ground node $108A_1$ may be $V_{DD}$−0.4V and the secondary ground node $108A_2$ may be $V_{DD}$−0.8V. All of these voltages are taken in as taps from the stack and with two additional high voltage (HV) supplies whose voltages are not available in the stack.

Each of these voltages are tapped at appropriate tapping points in the stack at a predefined sequence. In an exemplary embodiment, the at least two secondary supply voltages $106A_1$ and $106A_2$, and the secondary ground node $108A_2$ are tapped with respect to each of the near threshold computing chips 102A-N in the stack. This tapping results in multiple voltage differences within each of the NTC chips 102A-N. Out of them, two voltages $112A_1$-$112A_2$ are useful. Since each of the near threshold computing chips 102A-N comprises two voltage differences within them, two versions of internal voltages $112A_1$-$112A_2$ are generated. The two versions of the internal voltages $112A_1$-$112A_2$ are higher in value than a typical primary internal supply voltage of 0.4V. Each of the two versions of the internal voltage $112A_1$-$112A_2$ has a set voltage shift. In other words, the two voltage differences between respective supply voltages and ground voltages generate the two versions of the internal voltage $112A_1$-$112A_2$ within each of the one or more near threshold computing chips 102A-N. The each of the two versions of the internal voltage $112A_1$-$112A_2$ are configured for supplying standard in-chip functions.

By using the two secondary supply voltages $104_1$ and $104_2$ to the stack, in addition to the high-voltage $V_{DD}$ supply $104_0$, at $V_{DD}$+0.4 V and $V_{DD}$+0.8 V, and tapping these voltages from the stack, all the near threshold computing chips 102A-N can be made available with a 1.2V internal voltage inside them in two versions with a 0.4V shift. This way, each near threshold computing chip 102A-N shall be able to communicate with the near threshold computing chip above and the near threshold computing chip below it with 1.2V LVCMOS standard. Specifically, one of the two versions of the internal voltage, say for example, $112B_1$ within one near threshold computing chip 102B overlaps with at least one of the two versions of the internal voltage, say for example, $112A_2$, associated with one of a preceding near threshold computing chip 102A. Similarly, the other version of the internal voltage, say for example, $112B_2$ within one near threshold computing chip 102B overlaps with at least one of the two versions of the internal voltage, say for example, $112C_1$, associated with one of a subsequent near threshold computing chip 102C. This is clearly indicated in FIG. 3.

In an embodiment, the two versions of the internal voltage $112A_1$-$112A_2$ within each of the near threshold computing chip 102A-N allows communication between each of the near threshold computing chips 102A-N in the stack via at least two input-output components 114. Also, each of the two versions of the internal voltage $112A_1$-$112A_2$ are configured for supplying standard in-chip functions. Further, the first version of the internal voltage $112A_1$ within each near threshold computing chip 102A is the voltage difference between the first secondary supply voltage $106A_1$ and the primary ground voltage $108A_1$ with respect to the near threshold computing chip 102A. Furthermore, the second version of the internal voltage $112A_2$ within each near threshold computing chip 102A is the voltage difference between the second secondary supply voltage $106A_2$, and the second secondary ground voltage $108A_2$ with respect to the near threshold computing chip 102A. In an embodiment, the two versions of the internal voltages $112A_1$-$112A_2$ may be in range 1.2V to 1.8V.

The at least two input-output components 114 are configured for enabling communication between each of the near threshold computing chips 102A-N by interconnections between them made of simple wires.

In an additional embodiment, the near threshold computing chip 102A may also include at least two charge pumps 110. In such embodiment, the at least two charge pumps 110 are electrically coupled to the at least two input-output components 114A. The at least two charge pumps 110 are configured to boost two versions of internal voltage 112A to a higher voltage for communication between the near threshold computing chips 102A-N within the stack. Further, the at least two charge pumps 110 can be used internally to the near threshold computing chips 102A-N to boost the two versions of the internal voltages 1.2V to 1.5V or 1.8V supplies in order to be able to use 1.5V or 1.8V LVCMOS standards for the communication between the near threshold computing chips 102A-N. Further, output of the at least two charge pumps 110 are used for standard in chip functions module 113 for performing the standard in-chip functions. In an embodiment, the two versions of the internal voltage 0.8V or 1.2V are boosted to 1.5 V or 1.8 V or another voltage as needed for LVCMOS GPIO's by the least two charge pumps 110 and the perform other in-chip functions. Switched capacitor converters (which are charge pumps) can achieve fully on-chip implementations with no external components.

Although FIG. 2 depicts one of the near threshold computing chip 102A, it should be understood by a person skilled in the art that the various components as shown in this FIG. 2 are same for all the near threshold computing chips 102A-N in the stack and the same explanation as above shall apply for rest of the near threshold computing chips 102A-N in the stack.

FIG. 3 is a block diagram of a stack 300 of near threshold computing chips 102A-N capable of generating two versions of internal voltages 112, in accordance with an embodiment of the present disclosure. According to FIG. 3, a master controller 120 is communicatively coupled to stack of one or more near threshold computing chips 102A-N and one or more standard input output devices $114A_1$-$N_1$ and $114A_2$-$N_2$.

Each of the near threshold computing chips 102A-N are interconnected with each other using wires or data lines 118. Each of the near threshold computing chips 102A-N are electrically coupled to a primary supply voltage $104_0$ to the stack and the at least two secondary high supply voltages $104_1$-$104_2$ to the stack. Further, each of the near threshold computing chips 102A-N are electrically coupled to a primary ground voltage $108_1$ to the stack and a secondary ground voltage $108_2$ to the stack. Each of the near threshold computing chip 102A-N are supplied with a primary supply voltage 104A-N, at least two secondary voltages $106A_1$-$N_1$ and $106A_2$-$N_2$, a primary ground node $108A_1$-$N_1$ and a secondary ground node $108A_2$-$N_2$. The secondary ground node $108A_2$-$N_2$ is lower in value with respect to the primary ground node $108A_1$-$N_1$. The at least two secondary supply voltages $106A_1$-$N_1$ and $106A_2$-$N_2$ are higher in value with respect to the primary supply voltage 104A-N. In an exemplary embodiment, let us consider the primary supply voltage 104A to be 12V. Also, let us consider the at least two secondary supply voltages to the NTC chip 102A be 12V+0.4 V=12.4V 106A2 and 12V+0.8 V=12.8V $106A_1$. Also, let us consider the primary ground node to be 12V−0.4V=11.6V 108A1 and 12V−0.8 V=11.2V $108A_2$. These are the values depicted for the starting near threshold computing chip, 102A of the stack.

Similarly, the near threshold computing chip 102B has a primary supply voltage of 11.6V. Note that the near threshold computing chip 102B has been flipped horizontally with respect to near threshold computing chip 102A for ease of explanation and to depict the supply voltages clearly in the drawings. Therefore, the near threshold computing chip 102B comprises at least two secondary supply voltages to be 11.6V+0.4 V=12V 106B2 and 11.6V+0.8 V=12.4V $106B_1$. Also, let us consider the primary ground node to be 11.6V−0.4V=11.2V 108B1 and 11.6V−0.8 V=10.8V $108B_2$.

Similarly, the near threshold computing chip 102C has a primary supply voltage of 11.2V. Note that the near threshold computing chip 102C has been flipped horizontally with respect to the near threshold computing chip 102B for ease of explanation. Therefore, the near threshold computing chip 102C comprises at least two secondary supply voltages to be 11.2V+0.4 V=11.6V $106C_2$ and 11.2V+0.8 V=12V $106C_1$. Also, let us consider the primary ground node to be 11.2V−0.4V=10.8V $108C_1$ and 11.2V−0.8 V=10.4V $108C_2$. The same process is repeated until the 'N'$^{th}$ chip of the stack.

By using the two secondary high supply voltages $104_1$ and $104_2$ to the stack at $V_{DD}$+0.4 V and $V_{DD}$+0.8 V, in addition to the high-voltage $V_{DD}$ supply $104_0$ to the stack and tapping these voltages from the stack at tapping points 116, all the near threshold computing chips 102A-N can be made available with a 1.2V internal voltage inside them in two versions with a 0.4V shift. A detailed explanation of generation of the two versions of the internal voltages $112A_1$-$112A_2$ has been provided in FIG. 2. This way, each near threshold computing chip 102A-N shall be able to communicate with the near threshold computing chip above and the near threshold computing chip below it with 1.2V LVCMOS standard. Specifically, one of the two versions of the internal voltage, say for example, $112B_1$ within one near threshold computing chip 102B overlaps with at least one of the two versions of the internal voltage, say for example, $112A_2$, associated with one of a preceding near threshold computing chip 102A. Similarly, the other version of the internal voltage, say for example, $112B_2$ within one near threshold computing chip 102B overlaps with at least one of the two versions of the internal voltage, say for example, $112C_1$, associated with one of a subsequent near threshold computing chip 102C. The each of the two versions of the internal voltage $112A_1$-$112A_2$ are configured for supplying standard in-chip functions. Further, each of the near threshold computing chips 102A-N in the stack optionally comprises at least two charge pumps $110A_1$-$N_1$ and $110A_2$-$N_2$.

Although, FIG. 3 depicts the NTC chips until the NTC chip 3, 102C, it should be understood by a person skilled in the art that the entire structure of the stack with its interconnections (i.e., after the NTC chip 102C) shall extend uptil lowest voltage in the stack.

Figure 4:
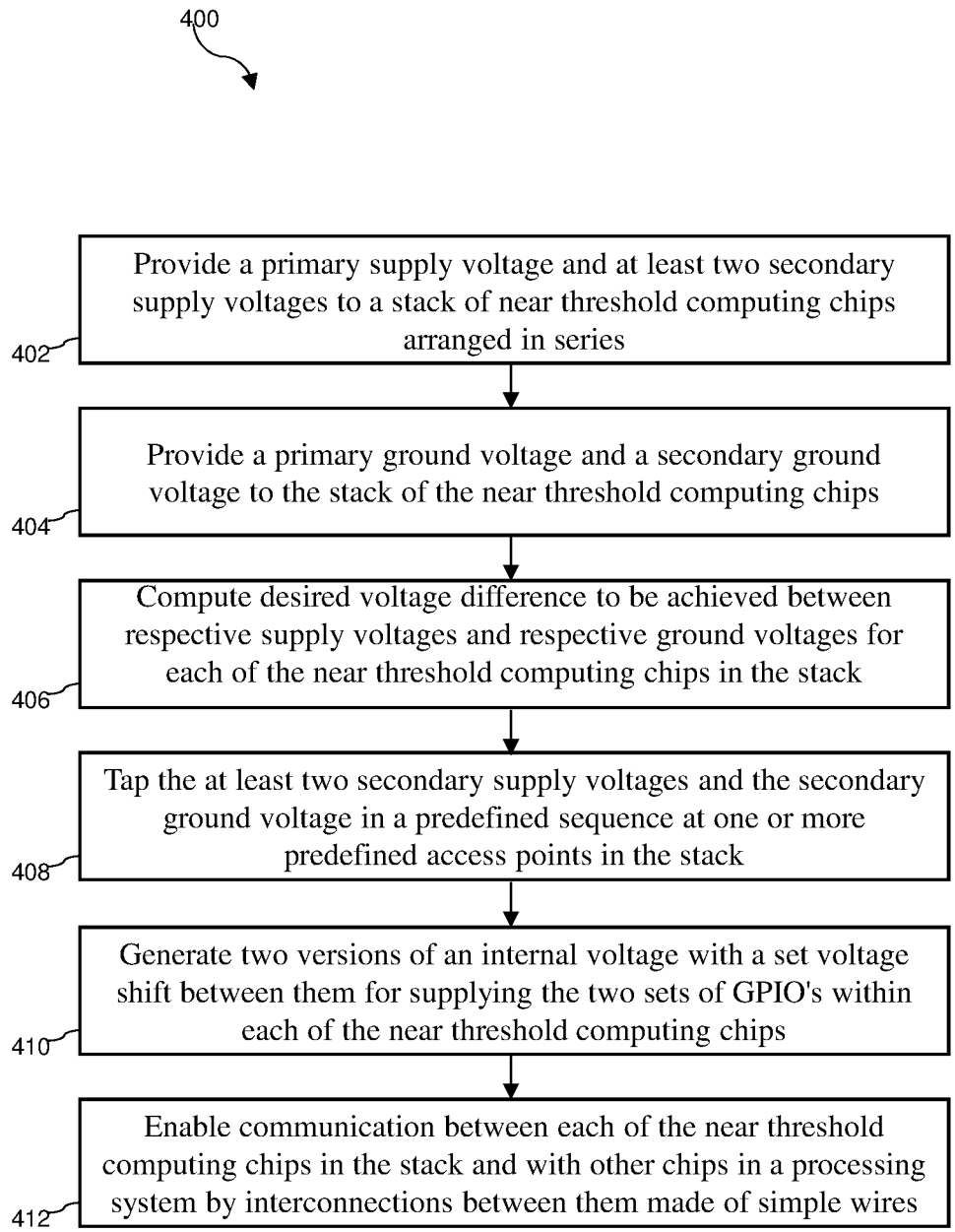
FIG. 4 is a process flow diagram illustrating an exemplary method for achieving inter-chip communication in voltage stacked near threshold computing systems using standard input-output (IO) devices, in accordance with an embodiment of the present disclosure.

FIG. 4 is a process flow diagram 400 illustrating an exemplary method for achieving inter-chip communication in voltage stacked near threshold computing systems using standard input-output (IO) devices, in accordance with an embodiment of the present disclosure.

At step 402, a primary supply voltage 104A-N and at least two secondary supply voltages $106A_1$-$N_1$ and $106A_2$-$N_2$ are provided each of the near threshold computing chips 102A-N arranged in series in a stack. The at least two secondary supply voltages $106A_1$-$N_1$ and $106A_2$-$N_2$ are higher in value with respect to the primary supply voltage 104A-N. The primary supply voltage 104A-N and the at least two secondary supply voltages $106A_1$-$N_1$ and $106A_2$-$N_2$ are externally connected to the near threshold computing chips 102A-N in the stack.

At step 404, a primary ground voltage $108A_1$-$N_1$ and a secondary ground voltage $108A_2$-$N_2$ is provided to the each of the near threshold computing chips 102A-N arranged in the stack. At step 406, desired voltage difference to be achieved between respective supply voltages and respective ground voltages are computed for each of the near threshold computing chips 102A-N in the stack. At step 408, the at least two secondary supply voltages $106A_1$-$N_1$ and $106A_2$-$N_2$ and the secondary ground node $108A_2$-$N_2$ are tapped in a predefined sequence at one or more predefined access points 116 in the stack based on the computed desired voltage difference. At step 410, two versions of an internal voltage $112A_1$-$112A_2$ with a set voltage shift between them are generated for supplying the two sets of GPIO's within each of the near threshold computing chips 102A-N. The two versions of the internal voltage $112A_1$-$112A_2$ are higher than a typical primary internal supply voltage of 0.4V. The each of the two versions of the internal voltage $112A_1$-$112A_2$ has a set voltage shift. The one of the two versions of the internal voltage $112A_1$-$112A_2$ within the one near threshold computing chip overlaps with at least one of the two versions of the internal voltage $112A_1$-$112A_2$ associated with one of a preceding near threshold computing chip and a subsequent near threshold computing chip in the stack. The each of the two versions of the internal voltage $112A_1$-$112A_2$ are configured for supplying standard in-chip functions.

The first version of the internal voltage $112A_1$ within each near threshold computing chip 102A-N is the voltage difference between the first secondary supply voltage $106A_1$-$106N_1$ and the primary ground voltage $108A_1$-$N_1$ with respect to the near threshold computing chip 102A-N. The second version of the internal voltage $112A_2$ within each near threshold computing chip 102A-N is the voltage difference between the second secondary supply $106A_2$-$N_2$ voltage and the second secondary ground voltage $108A_2$-$N_2$ with respect to the near threshold computing chip 102A-N.

At step 412, communication, via data lines 118, are enabled between each of the near threshold computing chips 102A-n in the stack and with other chips in a processing system by interconnections between them made of simple wires using the generated two versions of the internal voltage $112A_1$-$112A_2$.

The method further comprises boosting the two versions of the internal voltage $112A_1$-$112A_2$ to a higher voltage value, using one or more charge pumps 110, for communication between the near threshold computing chips 102A-N within the stack. The output of the one or more charge pumps 114 are used for standard in chip functions.

The method further comprises performing, by the near threshold computing chips 102A-N, compute tasks received from a master controller and communicating, by the near threshold computing chips 102A-N, with the master controller using one or more input-output components 114.

Various embodiments of the present system provide a technical solution to the problem of achieving inter-chip communication in voltage stacked near threshold computing systems using standard input-output (IO) devices with interconnections made of simple wires. By appropriately tapping the supply voltages from the stack and using two additional high-voltage supplies for the voltages unavailable on the stack, all the near threshold computing chips 102A-N can be made available with a 1.2V voltage inside them in two versions with a 0.4V shift. This way, each near threshold computing chip 102A-N is able to communicate with the near threshold computing chip 102A-N above and the near threshold computing chip below it with 1.2V LVCMOS standard.

The written description describes the subject matter herein to enable any person skilled in the art to make and use the embodiments. The scope of the subject matter embodiments is defined by the claims and may include other modifications that occur to those skilled in the art. Such other modifications are intended to be within the scope of the claims if they have similar elements that do not differ from the literal language of the claims or if they include equivalent elements with insubstantial differences from the literal language of the claims.

The embodiments herein can comprise hardware and software elements. The embodiments that are implemented in software include but are not limited to, firmware, resident software, microcode, etc. The functions performed by various modules described herein may be implemented in other modules or combinations of other modules. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid-state memory, magnetic tape, a removable computer diskette, a random-access memory (RAM), a read-only memory (ROM), a rigid magnetic disk and an optical disk. Current examples of optical disks include compact disk-read only memory (CD-ROM), compact disk-read/write (CD-R/W) and DVD.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

A representative hardware environment for practicing the embodiments may include a hardware configuration of an information handling/computer system in accordance with the embodiments herein. The system herein comprises at least one processor or central processing unit (CPU). The CPUs are interconnected via system bus to various devices such as a random-access memory (RAM), read-only memory (ROM), and an input/output (I/O) adapter. The I/O adapter can connect to peripheral devices, such as disk units and tape drives, or other program storage devices that are readable by the system. The system can read the inventive instructions on the program storage devices and follow these instructions to execute the methodology of the embodiments herein.

The system further includes a user interface adapter that connects a keyboard, mouse, speaker, microphone, and/or other user interface devices such as a touch screen device (not shown) to the bus to gather user input. Additionally, a communication adapter connects the bus to a data processing network, and a display adapter connects the bus to a display device which may be embodied as an output device such as a monitor, printer, or transmitter, for example.

A description of an embodiment with several components in communication with each other does not imply that all such components are required. On the contrary, a variety of optional components are described to illustrate the wide variety of possible embodiments of the invention. When a single device or article is described herein, it will be apparent that more than one device/article (whether or not they cooperate) may be used in place of a single device/article. Similarly, where more than one device or article is described herein (whether or not they cooperate), it will be apparent that a single device/article may be used in place of the more than one device or article, or a different number of devices/articles may be used instead of the shown number of devices or programs. The functionality and/or the features of a device may be alternatively embodied by one or more other devices which are not explicitly described as having such functionality/features. Thus, other embodiments of the invention need not include the device itself.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments. Also, the words "comprising," "having," "containing," and "including," and other similar forms are intended to be equivalent in meaning and be open-ended in that an item or items following any one of these words is not meant to be an exhaustive listing of such item or items or meant to be limited to only the listed item or items. It must also be noted that as used herein and in the appended claims, the singular forms "a," "an," and "the" include plural references unless the context clearly dictates otherwise.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based here on. Accordingly, the embodiments of the present invention are intended to be illustrative, but not limiting, of the scope of the invention, which is set forth in the following claims.

The invention claimed is:

1. A voltage stacked near threshold computing system for achieving inter-chip communication, wherein the voltage stacked near threshold computing system comprising:
   a stack of near threshold computing chips arranged in series, wherein each of the near threshold computing chips comprises:
   a primary supply voltage electrically coupled to the near threshold computing chips arranged in series;
   at least two secondary supply voltages electrically coupled to the near threshold computing chips arranged in series, wherein the at least two secondary supply voltages are higher in value with respect to the primary supply voltage;
   a primary ground node; and
   a secondary ground node lower in value with respect to the primary ground node, wherein the secondary ground node is lower by an internal supply voltage;
   wherein the at least two secondary supply voltage and a secondary ground voltage are tapped in a predefined sequence at one or more predefined access points in the stack to generate two versions of an internal voltage, within each of the one or more near threshold computing chips;
   wherein each of the two versions of the internal voltage is a voltage difference between respective supply voltages and ground voltages, wherein each of the two versions of the internal voltage has a set voltage shift, and wherein the set voltage shift is the internal supply voltage;
   wherein one of the two versions of the internal voltage within one near threshold computing chip overlaps with at least one of the two versions of the internal voltage associated with one of a preceding near threshold computing chip and a subsequent near threshold computing chip in the stack; and
   wherein each of the two versions of the internal voltage are configured for supplying standard in-chip functions.

2. The voltage stacked near threshold computing system of claim 1, wherein each of the computing chips further comprises one or more input-output component configured for enabling communication between each of the near threshold computing chips via data lines.

3. The voltage stacked near threshold computing system of claim 1, wherein the two versions of the internal voltage within each of the near threshold computing chip allows communication between each of the near threshold computing chips in the stack via one or more input-output components.

4. The voltage stacked near threshold computing system of claim 1, wherein each of the near threshold computing chips further comprises:
   one or more charge pumps electrically coupled to one or more input-output components, wherein the one or more charge pumps are configured to boost the two versions of the internal voltage to a higher voltage for communication between the near threshold computing chips within the stack.

5. The voltage stacked near threshold computing system of claim 4, wherein output of the one or more charge pumps are used for standard in chip functions.

6. The voltage stacked near threshold computing system of claim 1, wherein the near threshold computing chips within the stack are electrically inter-connected with each other using electrical wires.

7. The voltage stacked near threshold computing system of claim 1, wherein the primary supply voltage and the at least two secondary supply voltages for each of the near threshold computing chips are derived from a primary high supply voltage to the stack and at least two additional high-voltage supplies for voltages unavailable on the stack.

8. The voltage stacked near threshold computing system of claim 1, wherein first version of the internal voltage within each near threshold computing chip is the voltage difference between the first primary supply voltage and the primary ground voltage with respect to the near threshold computing chip.

9. The voltage stacked near threshold computing system of claim 1, wherein second version of the internal voltage within each near threshold computing chip is the voltage difference between the second secondary supply voltage and the secondary ground voltage with respect to the near threshold computing chip.

10. A method for achieving inter-chip communication in voltage stacked near threshold computing systems, wherein the method comprising:
providing a primary supply voltage and at least two secondary supply voltages to a stack of the near threshold computing chips arranged in series;
providing a primary ground voltage and a secondary ground voltage to the stack of the near threshold computing chips, wherein the secondary ground voltage has lower voltage value with respect to the primary ground voltage;
computing desired voltage difference to be achieved between respective supply voltages and respective ground voltages for each of the near threshold computing chips in the stack;
tapping the at least two secondary supply voltages and the secondary ground voltage in a predefined sequence at one or more predefined access points in the stack based on the computed desired voltage difference;
generating two versions of an internal voltage within each of the near threshold computing chips with respect to the tapping, wherein the each of the two versions of the internal voltage has a set voltage shift, wherein the set voltage shift is an internal supply voltage, and wherein the each of the two versions of the internal voltage are configured for supplying standard in-chip functions; and
enabling communication, via data lines, between each of the near threshold computing chips in the stack and with other chips in a processing system by interconnections between the chips made of wires.

11. The method of claim 10, wherein the at least two secondary supply voltages are higher in value with respect to the primary supply voltage.

12. The method of claim 10, wherein one of the two versions of the internal voltage within the one near threshold computing chip overlaps with at least one of the two versions of the internal voltage associated with one of a preceding near threshold computing chip and a subsequent near threshold computing chip in the stack.

13. The method of claim 10, further comprising:
boosting the two versions of the internal voltage to a higher voltage value, using one or more charge pumps, for communication between the near threshold computing chips within the stack.

14. The method of claim 13, wherein output of the one or more charge pumps are used for standard in chip functions.

15. The method of claim 10, wherein the primary supply voltage and the at least two secondary supply voltages for each of the near threshold computing chips are derived from a primary high supply voltage to the stack and at least two additional high-voltage supplies for voltages unavailable on the stack.

16. The method of claim 10, wherein first version of the internal voltage within each near threshold computing chip is the voltage difference between the first primary supply voltage and the primary ground voltage with respect to the near threshold computing chip.

17. The method of claim 10, wherein second version of the internal voltage within each near threshold computing chip is the voltage difference between the second secondary supply voltage and the secondary ground voltage with respect to the near threshold computing chip.

* * * * *